JUNCTION GROWING TECHNIQUE

Filed Oct. 20, 1959

INVENTOR
Elmer A. Wolff, Jr.

BY Stevens, Davis, Miller & Mosher
ATTORNEYS 3,072,504
Patented Jan. 8, 1963

3,072,504
JUNCTION GROWING TECHNIQUE

Elmer A. Wolff, Jr., Richardson, Tex., assignor to Texas Instruments Incorporated, Dallas, Tex., a corporation of Delaware Filed Oct. 20, 1959, Ser. No. 847,579
3 Claims. (Cl. 148—1.5)

This invention relates to the fabrication of semiconductor signal translating devices and more particularly to a new and improved method for mass producing such devices having P-N junctions therein.

In the semiconductor art, a region of semiconductor material containing an excess of donor type impurities and hence an excess of free electrons is considered to be an N-type region, while a region containing an excess of acceptor type impurities resulting in a deficit of electrons, or an excess of holes, is known as a P-type region. The boundary between the two regions is termed a P-N junction. The specimen of semiconductor material containing such a P-N junction may be fabricated into what is termed a P-N junction semiconductor device. Such a device is useful as a rectifier. When a semiconductor device is formed having two N-type regions separated by a P-type region, it is termed an N-P-N junction transistor. Conversely, transistors may be formed with two P-type regions separated by an N-type region which is termed a P-N-P junction transistor. Other combinations are also possible as, for example, by inclusion of a region of intrinsic semiconductor material, having an excess of neither electrons N nor holes, N-P-I-N and P-N-I-P junction transistors are obtained.

Different methods of forming P-N junctions in semiconductor devices are known and include fusion of bodies containing impurities of opposite types, diffusion of an impurity of one type into a body having an impurity region of the opposite type, and crystal pulling techniques wherein a seed crystal of semiconductor material of one conductivity type is slowly withdrawn from a melt of the base semiconductor material whose constituency is changed to produce P-N junctions in the growing crystal ingot. All of these methods have advantages and disadvantages but none are particularly adapted to mass produce transistors or rectifiers of adequate quality. The fusion process necessarily is limited to individual device fabrication, while the diffusion process necessitates tens and, in some instances, hundreds of hours to effect the desired impurity penetration. Crystal pulling techniques also involve relatively slow rates at which the crystal is drawn plus precise controls to regulate the thickness of the base region and to prevent formation of lattice defects in the crystal. The crystal pulling technique is usually limited to the growth of two P-N junctions in a bar or ingot and, thus, only a small portion of the grown crystal may be used in making devices.

Accordingly, it is a primary object of the present invention to provide a method of producing P-N junctions more rapidly and in larger quantity than has heretofore been possible in the prior state of the art.

Another object of the invention is to provide a multiple junction forming technique for producing semiconductors which is simple and lends itself to mass production thereby lowering the cost of device manufacture.

A further object of the invention is to provide a method for forming P-N junctions which is accurately controllable to allow the formation of junctions of uniform and reproducible characteristics.

Another object of this invention is to provide a method for forming P-N junctions whereby the maximum utilization of material is achieved.

Still another object of this invention is to provide a method for forming P-N junctions which are relatively planar.

The method of the present invention broadly comprises the steps of growing a bar of semiconductive material of one conductivity type; removing a portion of the bar to provide a flat surface; placing doping material at predetermined intervals on the flat surface of the bar, such doping material including both donor and acceptor impurity substances; melting the doped zones in sequence or simultaneously while keeping the undoped zones in relatively cool, solid state; allowing the doped zones to cool to room temperature, slicing the bar at points substantially central of each original doped and undoped zone and in a direction transverse to the axis of the bar to yield N-P-N or P-N-P junction slices; and dicing these slices to yield a multiplicity of transistor bars.

The novel features that are considered characteristic of the invention are set forth with particularity in the appended claims. The invention itself, however, both as to its organization and its method of operation, together with additional objects and advantages thereof, will best be understood from the following description when read in connection with the accompanying drawing, wherein like reference characters indicate like parts throughout the several figures and in which:

Figure 1:
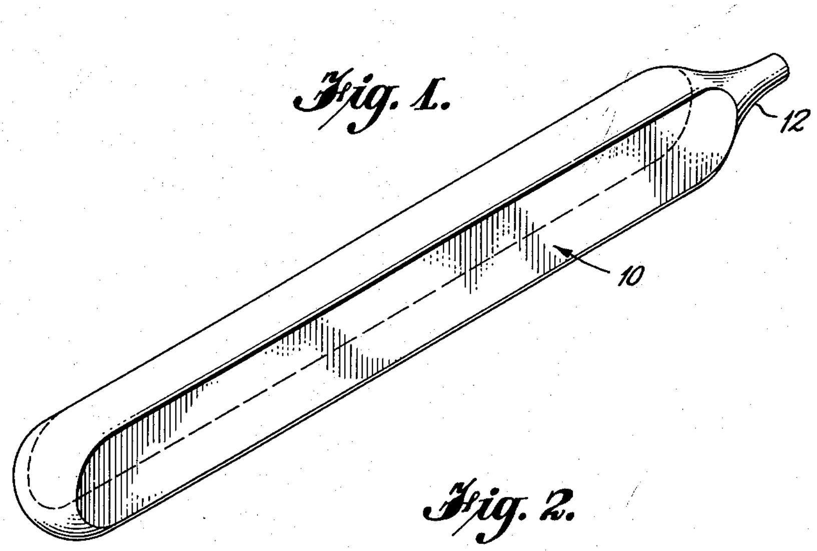
FIG. 1 is a perspective view of a monocrystalline semiconductor bar which may be employed in practicing the method of this invention.

Referring now to the drawing, the present invention will be explained with respect to a specific example, i.e., the method of mass producing germanium P-N-P junction transistors. FIG. 1 illustrates an elongated bar or ingot 10 of single crystal P-type germanium material grown from a seed 12. The bar 10 is illustrated as having two opposite flat faces formed by sawing, grinding or otherwise. The shape and size of the bar are not critical in the present method as even a cylindrical ingot may be used. However, it is desirable to flatten at least one face somewhat to facilitate placing the doping material on the ingot. A suitable composition for bar 10 is germanium doped with an acceptor material such as phosphorous to yield a resistivity of approximately one ohm-centimeter.

Figure 2:
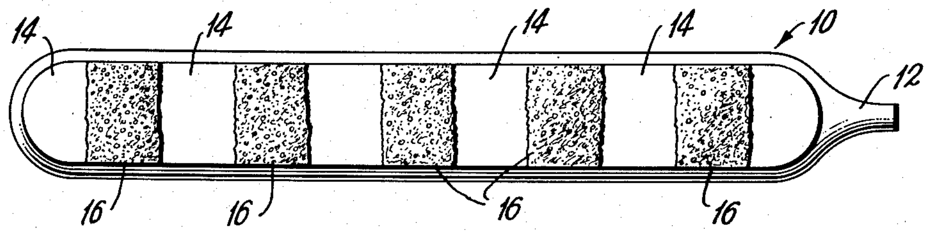
FIG. 2 is a plan view of the bar of FIG. 1 illustrating a step of adding doping material to zones of the bar at predetermined intervals.

FIG. 2 illustrates the next step of the method. A mixture, comprising a donor-material such as arsenic and an acceptor material such as gallium, is laid on bar 10 at predetermined intervals in the zones referenced 16. Zones 16 are separated by zones 14 which are free of the mixture. A suitable proportion of the doping materials has been found to be one hundred fifty milligrams of a germanium-1% arsenic "alloy" and 400 milligrams gallium. About 30 milligrams of this mixture may be spread on each zone 16. Although the dimensions are not critical, a suitable width for the zones 14 and 16 was found to be approximately 100 mils each.

The bar 10 is next laid horizontally in a suitable furnace and the doped zones 16 melted simultaneously or in sequence. The furnace is preferably evacuated or filled with an inert gas. A suitable melting temperature is in the range of 800–900° C. The individual doped zones may be heated by spaced heating elements which may be either of the induction or resistance type. Alternatively, the bar may be moved past a single zone or plurality of heating zones appropriately spaced apart. In such instance, the bar would alternately travel and rest, the rest period being adequate to accomplish the melting plus a short period of approximately three to five minutes to allow diffusion of the doping materials. It should be noted that the zones 14 must not be melted during the travel time.

Figure 3:
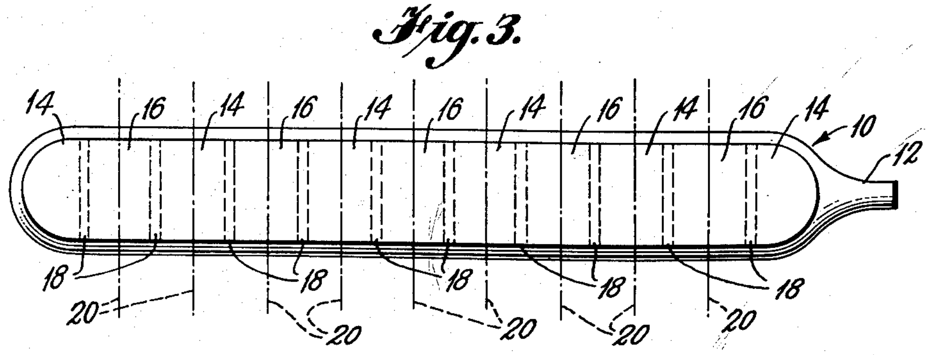
FIG. 3 is a plan view similar to FIG. 2 illustrating the junctions after melting of the doped zones.

During melting of the zones 16, the undoped zones 14 are maintained relatively cool and in solid state. Thus, the impurity materials quickly diffuse into the adjacent solid zones. The melted zones are then allowed to cool and solidify. As shown in FIG. 3, solidification takes place from the unmelted zones 14 to regrow the crystal in the zones 16. Since the arsenic will diffuse from the molten zones into the remaining solid portions of the crystal at a higher rate than will the gallium, and in sufficient quantity to overcome the effect of the acceptor impurities already present in the diffusion region, narrow regions 18 (FIG. 3), of N-type conductivity germanium will be formed. Also, since the proportions of N- and P-type dopes used were such that the P-type dopes predominated the mixture, the zones 16 will be of P-type conductivity upon recrystallization of these zones. Thus, upon cooling, the bar has a plurality of N-type conductivity zones 18, and recrystallized P-type conductivity zones 16 and a plurality of zones 14 of the original material. These various zones are illustrated in FIG. 3.

Figure 4:
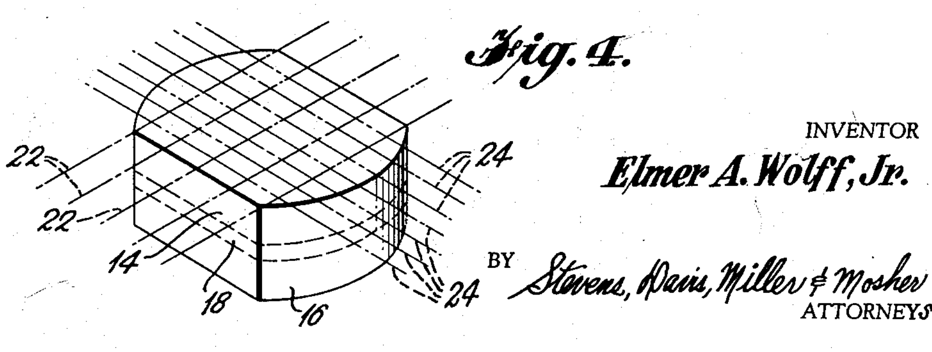
FIG. 4 is a perspective view of a slice cut from the bar containing a P-N-P junction and illustrating possible dicing lines for cutting a multiplicity of transistor bars.

The cooled bar 10 is next sawed along the lines 20, FIG. 3, intermediate the layers 18, in a direction transverse to the axis of the bar yielding slices, such as depicted in FIG. 4, each having P-type layers 14 and 16 separated by N-type layer 18. The final step of the method involves dicing the slices each into a multiplicity of P-N-P transistor bars by cutting along the broken lines 22 and 24 shown in FIG. 4. The individual bars may be soldered to connecting leads and installed in supporting and protective structures in accordance with known methods.

Although the invention has been described with particular reference to the mass production of P-N-P junction germanium transistors, it may be practiced also with other semiconductors, for example, silicon and with other acceptor doping materials such as aluminum or boron, and other donor impurities such as phosphorous or antimony. In forming silicon transistors, higher melting temperatures are required. A suitable combination of impurities to add to silicon is a mixture of aluminum and arsenic which will produce thin P-type areas at the junction of the melted and unmelted zones between adjacent N-type areas.

The proper resistivity to be used for the original crystal, the proportions and types of doping materials to be used in the molten zone and the proper length of time to allow the zones to remain molten, for diffusion, for any particular semiconductor material and any desired device characteristics may be readily calculated by those skilled in the art from information available in the literature and in light of the above disclosure.

Although a certain specific embodiment of the invention has been shown and described, it is obvious that many modifications thereof are possible. The invention, therefore, is not to be restricted except insofar as is necessitated by the prior art and by the scope of the appended claims.

What is claimed is:

1. A method of producing semiconductor elements which comprises forming an elongated body of monocrystalline semiconductor material of one conductivity type, placing doping material including both one conductivity type and opposite conductivity type impurities on spaced zones of said body, said opposite conductivity type impurity having a higher diffusion coefficient than said one conductivity type impurity, melting said spaced zones while keeping the portions of the body between said zones in relatively cool, solid state to form areas of opposite conductivity type at the interfaces between the melted and unmelted zones, the melted zones extending through th entire cross section of the body transverse to the long dimension thereof, cooling said melted zones and cutting said body intermediate said formed areas of opposite conductivity type to produce semiconductor elements each having at least one P-N junction.

2. A method of mass producing semiconductor elements which comprises forming a bar of monocrystalline germanium of P conductivity type, placing a doping mixture of arsenic and gallium on spaced zones of said bar, melting said spaced zones while keeping the undoped areas between zones in relatively cool, solid state thereby forming areas of N-type conductivity at the junction of the melted and unmelted zones, the melted zones extending transversely through the entire cross section of the bar, allowing said melted zones to cool, sawing said bar at points between the said formed areas of N-type conductivity to produce P-N-P transistor slices, and dicing said slices to produce a multiplicity of P-N-P transistor bars.

3. A method of mass producing semiconductor elements which comprises forming a bar of silicon of N conductivity type, placing a doping mixture of arsenic and aluminum on spaced zones of said bar, melting said spaced zones while keeping the undoped areas between zones in relatively cool, solid state thereby forming areas of P-type conductivity at the junctions of the melted and unmelted zones, the melted zones extending transversely through the entire cross section of the bar, allowing said melted zones to cool, sawing said bar at points between said formed areas of P-type conductivity to produce N-P-N transistor slices and dicing said slices to yield a multiplicity of N-P-N transistor bars.

References Cited in the file of this patent

UNITED STATES PATENTS

| | | |
|---|---|---|
| 2,739,088 | Pfann | Mar. 20, 1956 |
| 2,836,521 | Longini | May 27, 1958 |
| 2,888,782 | Epstein | June 2, 1959 |